United States Patent [19]
Tomita

[11] Patent Number: 6,014,394
[45] Date of Patent: Jan. 11, 2000

[54] SEMICONDUCTOR LASER

[75] Inventor: Akihisa Tomita, Tokyo, Japan

[73] Assignee: NEC Corporation, Tokyo, Japan

[21] Appl. No.: 08/934,888

[22] Filed: Sep. 22, 1997

[30] Foreign Application Priority Data

Sep. 26, 1996 [JP] Japan .................................. 8-254618

[51] Int. Cl.⁷ .................. H01S 3/19; H01S 3/10
[52] U.S. Cl. ................... 372/45; 372/46; 372/50; 372/20
[58] Field of Search ................ 372/45, 46, 50, 372/20

[56] References Cited

U.S. PATENT DOCUMENTS

| | | | |
|---|---|---|---|
| 5,297,158 | 3/1994 | Naitou et al. | 372/46 |
| 5,416,790 | 5/1995 | Yodoshi et al. | 372/46 |
| 5,452,316 | 9/1995 | Seki et al. | 372/46 |
| 5,509,024 | 4/1996 | Bour et al. | 372/45 |
| 5,608,752 | 3/1997 | Goto et al. | 372/46 |

FOREIGN PATENT DOCUMENTS

| | | |
|---|---|---|
| 62-18082 | 1/1987 | Japan . |
| 2-78290 | 3/1990 | Japan . |
| 6-216460 | 8/1994 | Japan . |
| 6-326406 | 11/1994 | Japan . |
| 7-22695 | 1/1995 | Japan . |
| 7-321395 | 12/1995 | Japan . |
| 8-204282 | 8/1996 | Japan . |
| 8-228040 | 9/1996 | Japan . |
| 8-264902 | 10/1996 | Japan . |
| 9-64472 | 3/1997 | Japan . |
| 9-83064 | 3/1997 | Japan . |
| 9-97948 | 4/1997 | Japan . |

OTHER PUBLICATIONS

Hecht, J., Understanding Lasers, Second Edition, IEEE Press, pp. 256–260, 1994.

H. Adachi et al., "Self–Sustained Pulsation in 650–nm–Band AlGaInP Visible–laser Diodes with Highly Doped Saturable Absorbing Layer", pp. 1406–1408, IEEE Photonics Technology Letters, vol. 7, No. 12, Dec. 1995.

*Primary Examiner*—Hemang Sanghavi
*Assistant Examiner*—Sung T. Kim
*Attorney, Agent, or Firm*—Young & Thompson

[57] ABSTRACT

A semiconductor laser is provided having excellent characteristics such as long life, less variable threshold current due to the temperature change, and low noise, by effectively preventing leakage of electrons from the active layer. The semiconductor laser is provided with a electron barrier layer and the guide layer of the laser is doped with an n-type dopant, such that a high electron barrier is constructed between the guide layer and the cladding layer.

21 Claims, 8 Drawing Sheets

22: CONTACT LAYER
21: CURRENT CONFINEMEMT LAYER
20: p-TYPE CLAD LAYER
19: SATURABLE ABSORPTION LAYER
17: ELECTRON BARRIER LAYER
14: QUANTUM-WELL ACTIVE LAYER
12: n-TYPE CLAD LAYER
11: SUBSTRATE

GUIDE LAYER    p-type CLAD LAYER

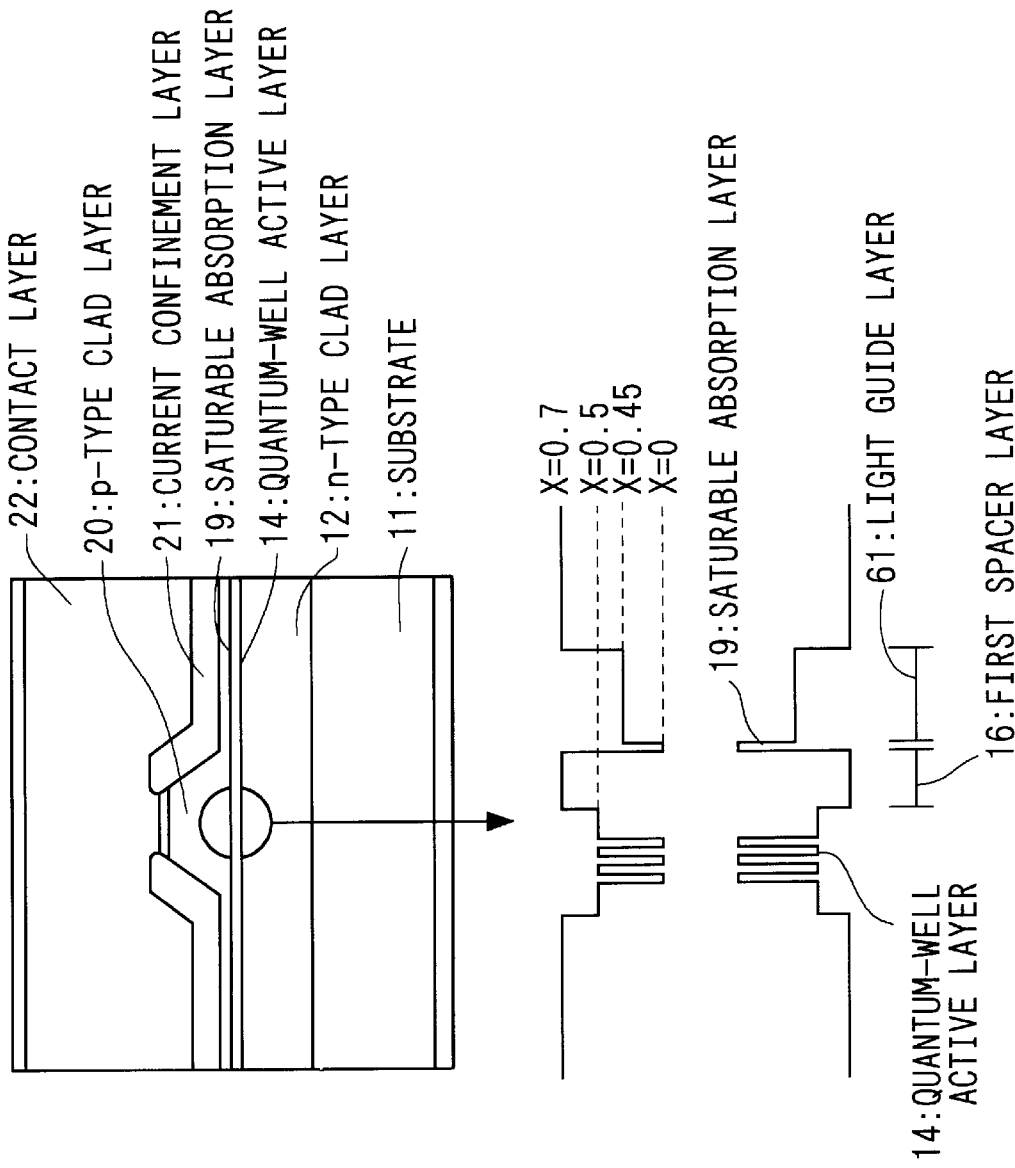

SEMICONDUCTOR LASER

BACKGROUND OF THE INVENTION

1. Field of the Invention

The invention relates to a semiconductor laser used as, for example, a light source in optical information processing systems.

2. Description of the Related Art

A semiconductor laser used as a light source in information processing systems is required to have characteristics such as long life, stability of threshold current against variation in temperature, and low noise. When a semiconductor laser is used in an information processing apparatus, noise induced by reflected light returning from other elements of the apparatus causes a serious problem. In order to suppress the noise caused by the returning light, the output of the semiconductor laser was generally modulated at a high frequency to reduce the coherence of the laser light. However, a self-sustained pulsation laser, which makes it possible to periodically pulse laser output with vibrating intensity without using an external modulation circuit, is presently of interest due to its low cost.

In order to obtain self-sustained pulsation, it is necessary for a semiconductor laser to include a saturable absorbing layer, in which the absorption loss varies with the intensity of light. The self-sustained pulsation laser emits laser light with vibrating intensity. This periodical vibration of the light intensity is caused by vibrating carrier population. When the laser first lases, the laser emits high intensity laser light having an intensity which is higher than that of the stationary state and which consumes the majority of the carriers; thus, the light intensity in the second lasing is far less than that of the first laser light due to the reduced carrier population below the threshold value. In this case, the vibration of the light intensity relax with time, and the light intensity attenuates to a constant value.

However, if there is a saturable absorbing layer in the laser, the light absorption becomes high while the light pulse is rising, and the light absorption becomes low while the light pulse is falling. Thus, the saturable absorbing layer makes the light intensity approach zero. Therefore, the saturable absorbing layer suppresses the attenuation by the relaxation and realizes the self-sustained pulsation. Conditions of self-sustained pulsation for a semiconductor laser are reported by Ueno and Lang in the Journal of Applied Physics, vol. 58, p. 1682, 1985. This paper indicates that it is necessary for the saturable absorbing layer to have the same order of loss as that of a resonator and the self-sustained pulsation occurs when the carrier life of the saturable layer is shorter than that of the active layer and when the differential gain coefficient of the saturable absorbing layer is larger than that of the active layer.

One of the methods for producing the saturable absorbing layer is disclosed by Kuroe and Kurihara in Japanese Patent Application, First Publication, No. 61-84891. The same method is also reported by Adachi, et al., in Photonics Technology Letters, vol. 7, p.1406, 1995. FIG. 11 shows a schematic representation of a self-pulsation laser and its band diagram, which are reported by Adachi et al. As illustrated, the laser is constructed by laminating layers on the n type GaAs substrate 11 in the order from the bottom, an n-type clad layer 12 made of n-type $(Al_{0.7}Ga_{0.3})_{0.5}In_{0.5}P$, an undoped quantum-well active layer 14, a saturable absorbing layer 19 made of p-type $Ga_{0.5}In_{0.5}P$ with a thickness of 5 nm, a light guide layer 61 made of p-type $(Al_{0.45}Ga_{0.55})_{0.5}In_{0.5}P$, and a p-type clad layer 20 consisting of $(Al_{0.7}Ga_{0.3})_{0.5}In_{0.5}P$. It is advantageous to prepare the saturable absorbing layer on the active layer in that the composition or the thickness of the saturable absorbing layer can be selected independently so that the properties of the layer can be controlled with greater freedom and that the light coupling parameter of the saturable absorbing layer with the active layer can be determined with good reproducibility during the crystal growth process. In fact, Adachi, et al., realized the self-sustained pulsation by reducing the carrier life by doping a p-type impurity at a concentration of $2 \times 10^{18}$ cm$^{-3}$ in the saturable absorbing layer.

An increase of the threshold current at higher temperature is presumed to be caused by a leakage of electrons from the active layer to the clad layer. A measure is proposed to construct an Multiple Quantum Barrier (MQB) in which the barrier of a superlattice is effectively increased by the quantum interference.

However, the self-sustained pulsation of that laser disappears at higher temperatures. Adachi et al., reported in "Extended abstracts of the 43rd Spring Meeting, the Japan Society of Applied Physics and Related Societies 26a-C-10" that it is necessary to decrease the band-gap of the saturable absorbing layer to more than 80 meV lower than that of the active layer, if self-oscillation at 80° C. is desired. However, due to the reduced band-gap, the light absorption of the saturable absorbing layer increases and its threshold current at 25° C. increases to more than 100 mA. The high threshold current generates heat, which deteriorates the reliability of the self-sustained pulsation laser. In order to provide a laser having a long service life, the threshold current must be below 50 mA at room temperature.

Disappearance of the self-sustained pulsation at higher temperatures is caused by leakage of electrons from the active layer, by decreasing the carrier life in the active layer, and by decreasing absorption due to electrons flowing into the saturable absorbing layer. In order to maintain the self-sustained pulsation at higher temperatures, it is necessary to confine electrons so as to prevent them from flowing out from the active layer.

The Multiple Quantum Barrier proposed in the reference is effective for increasing the barrier height for electrons at the Γ-point in the conduction band, but not effective for electrons at the X-point. In a material system of GaInP/AlGaInP used for a visible-light laser, both energies at Γ and X-points are similar and the energy difference is as small as several 10 meV, so that electrons passing X-point tend to leak. Accordingly, it is generally difficult to suppress electron-leakage by MQB.

SUMMARY OF THE INVENTION

Objects of the present invention are to provide a semiconductor laser having excellent performances such as long life, minimal variation of the threshold current due to changes of temperature, and low noise, by confining electrons so as not to flow out from the active layer.

The semiconductor laser of the present invention is provided with the following features.

One aspect of the invention is a semiconductor laser comprising a substrate for the semiconductor laser, an n-type cladding layer formed on the substrate, an active layer on the n-type cladding layer, a guide layer formed on the active layer, and a p-type cladding layer formed on the guide layer, and an n-type dopant is doped in at least a portion of the guide layer, or in at least a portion of the active layer.

Another aspect of the invention is a semiconductor laser comprising a substrate, an n-type cladding layer, an active layer, the guide layer, a p-type clad layer, and a saturable absorbing layer which is in the p-type cladding layer and whose band-gap is smaller than the band-gap of the active layer. Furthermore, a band-gap of an undoped material of the saturable absorbing layer is 5 meV to 45 meV lower than that of an undoped material of the active layer.

The other aspect of the invention is that the saturable absorption layer and the active layer of the aforementioned semiconductor laser have a quantum-well structure.

A further aspect of the invention is a semiconductor laser comprising a substrate, an n-type cladding layer formed on the substrate, an active layer formed on the n-type cladding layer, a guide layer formed on the active layer, and a p-type cladding layer formed on the guide layer, and an electron barrier layer between the guide layer and the p-type cladding layer or in the p-type cladding layer. In addition, the active layer is made of GaInP or AlGaInP, the p-type cladding layer is made of AlGaInP and the electron barrier layer, is made of AlAs, InAlAsP, or InGaAsP. Furthermore, a material for the electron barrier layer can be specfied as $In_{1-x}Al_xAs_yP_{1-y}$, where $0 \leq x \leq 1$ and $0.6 \leq y \leq 1$.

BRIEF DESCRIPTION OF THE DRAWINGS

FIG. 11 shows the structure of a conventional visible-light low-noise laser.

DETAILED DESCRIPTION OF EMBODIMENTS

In order to obtain a laser which can be operable at higher temperatures, the leakage of electrons from the active layer must be prevented. In the present invention, leakage is prevented in the following methods.

Figure 4:
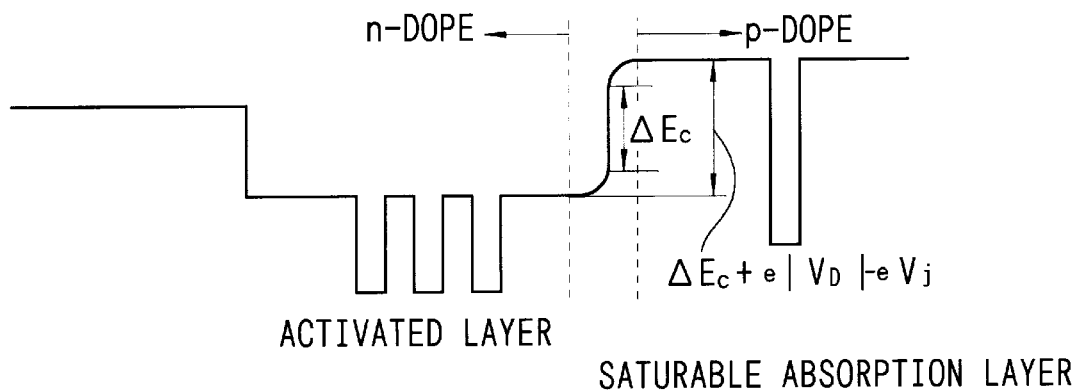
FIGS. 4 and 5 are diagrams for explaining that the electron barrier can be enhanced by translating the position of the p-n junction.
Figure 5:
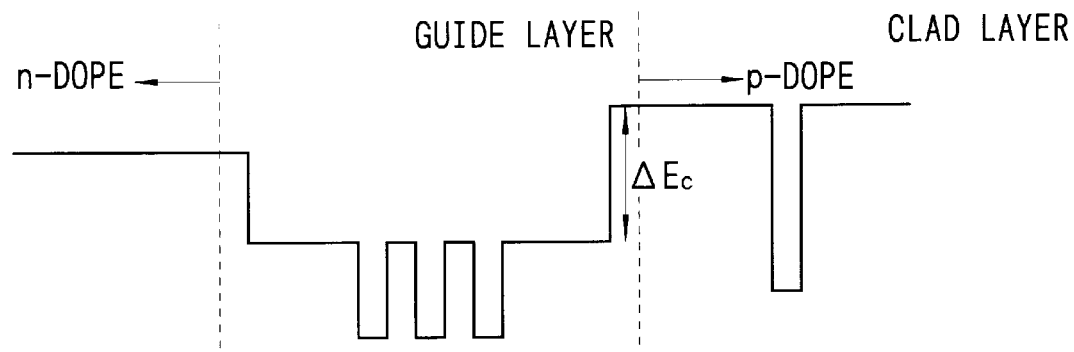

The first method is to enlarge the effective height of the electron barrier by creating a electrostatic potential between the guide layer and the cladding layer. FIGS. 4 and 5 show a comparison of the barrier structure of lasers of the present invention and conventional lasers. As can be seen from the figures, the guide layer of the present laser in FIG. 4 is doped with an n-type dopant so that the distance between the n-type doped layer and the p-type doped layer is smaller than the corresponding distance of prior art FIG. 5, and electric dipoles are created. Consequently, the potential difference between the guide layer and the cladding layer is enlarged and the enlarged potential difference suppresses the leakage of electrons.

Figure 6:
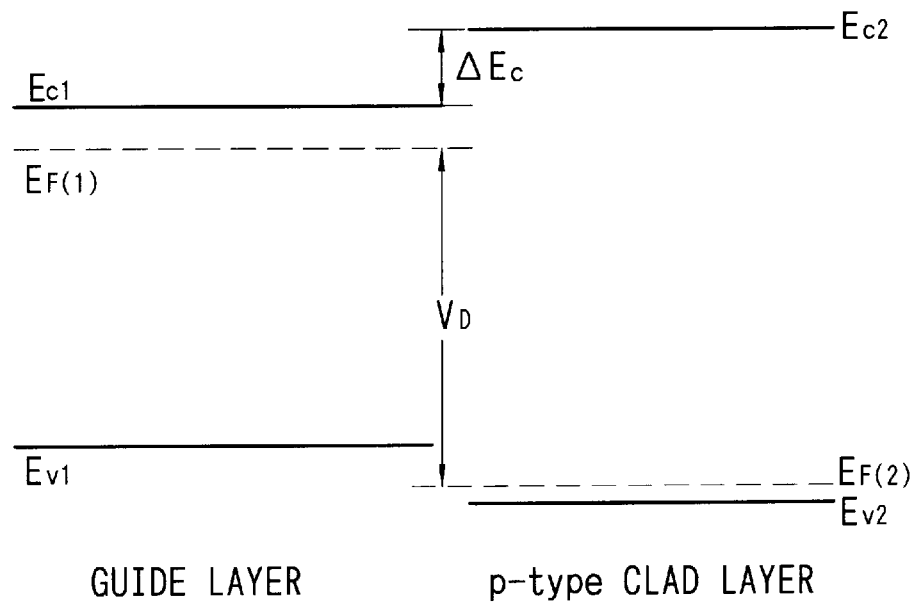
FIG. 6 shows a band diagram when the guide layer is apart from the p-type cladding layer.
Figure 7:
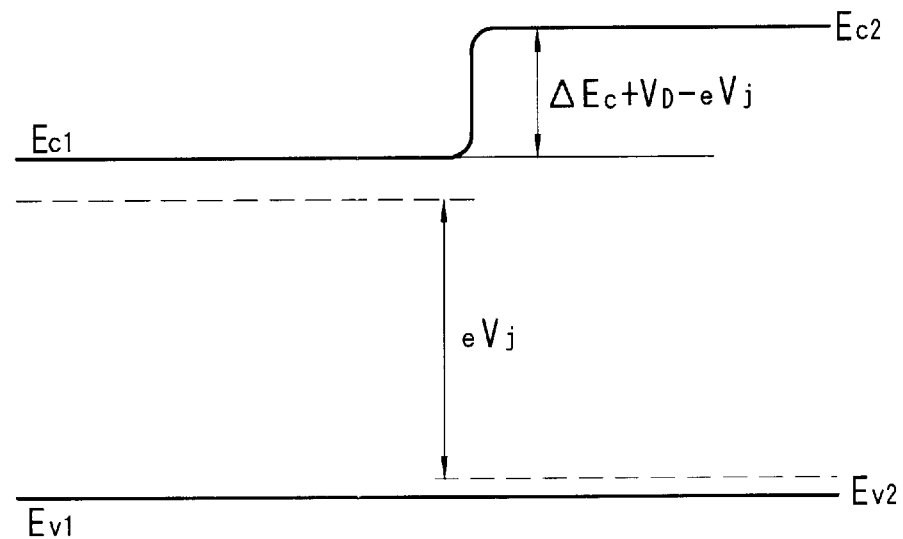
FIG. 7 shows a band-diagram when the guide layer and the p-type clad layer is bonded to form a junction and when the junction is biased in the forward direction.

FIGS. 6 and 7 are diagrams showing the above principle in further detail. As shown in FIG. 6, when the guide layer and the clad layer are apart from each other, energies at both ends of the conduction band and both Fermi levels are set as Ec1, Ec2, EF(1) and EF(2), respectively. When the guide layer is doped with an n-type dopant so that the n-type guide layer is closer to the p-type cladding layer, the band structure changes to that shown in FIG. 7. That is, the potential barrier is generated which is composed of the potentials caused by the band discontinuity and the potential based on the p-n junction. Thus, the potential barrier against electrons becomes large as shown in FIG. 7, when biased in the forward direction. The potential barrier against electrons is expressed as $$\Delta\phi = \Delta Ec + VD - eVj = \Delta Ec + (EF(1) - EF(2)) - eVj$$

wherein, Vj is a junction voltage, and the potential barrier increases by VD−eVj.

Figure 2:
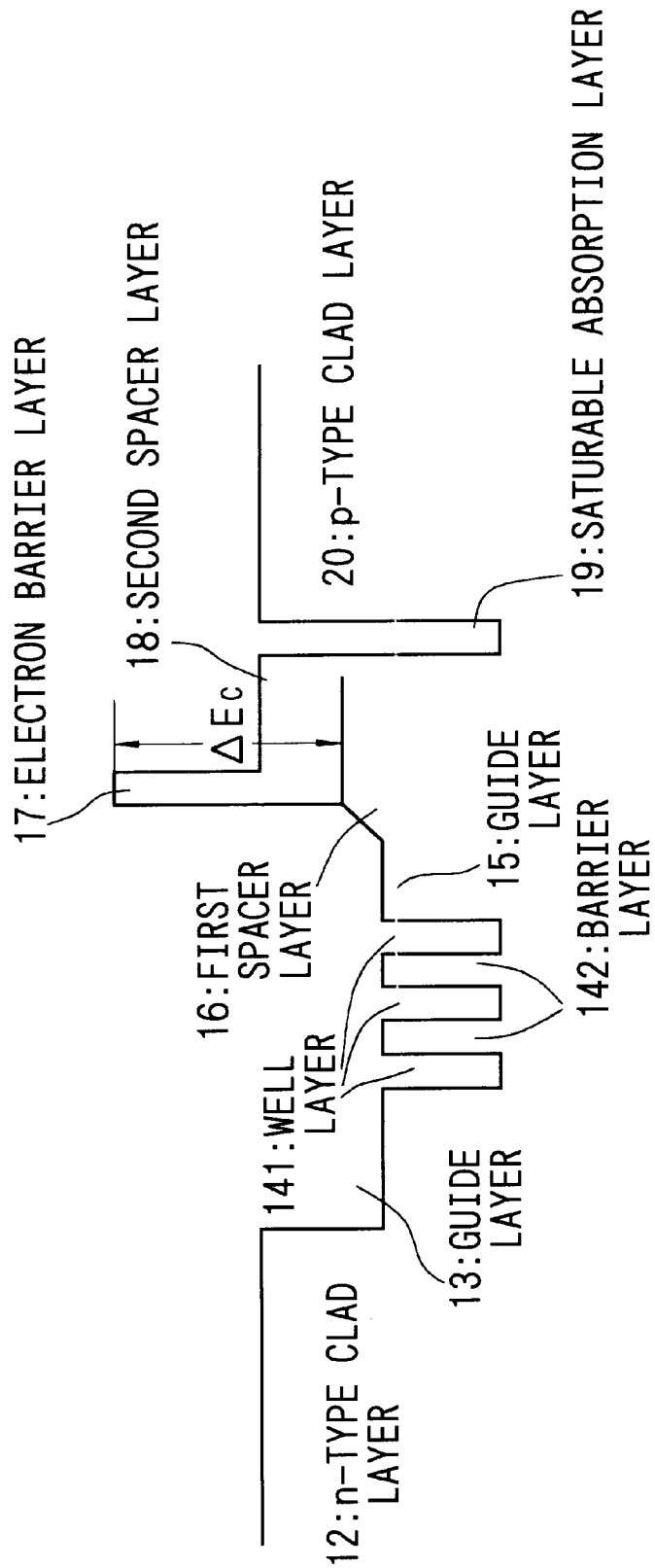
FIG. 2 depicts a band diagram of the semiconductor laser shown in FIG. 1.

The second method is, as shown in FIG. 2, to insert an electron barrier 17 made of a material having high conduction band energy between the guide layer 15 and the cladding layer 20. It is desirable that the energy of the conduction band end of the electron barrier layer be higher by 300 meV at the Γ-point, and by 100 meV at the X-point. In the following, a suitable material will be described, wherein GaAs is used as the substrate and AlGaInP is used as the p-type cladding layer.

Figure 10:
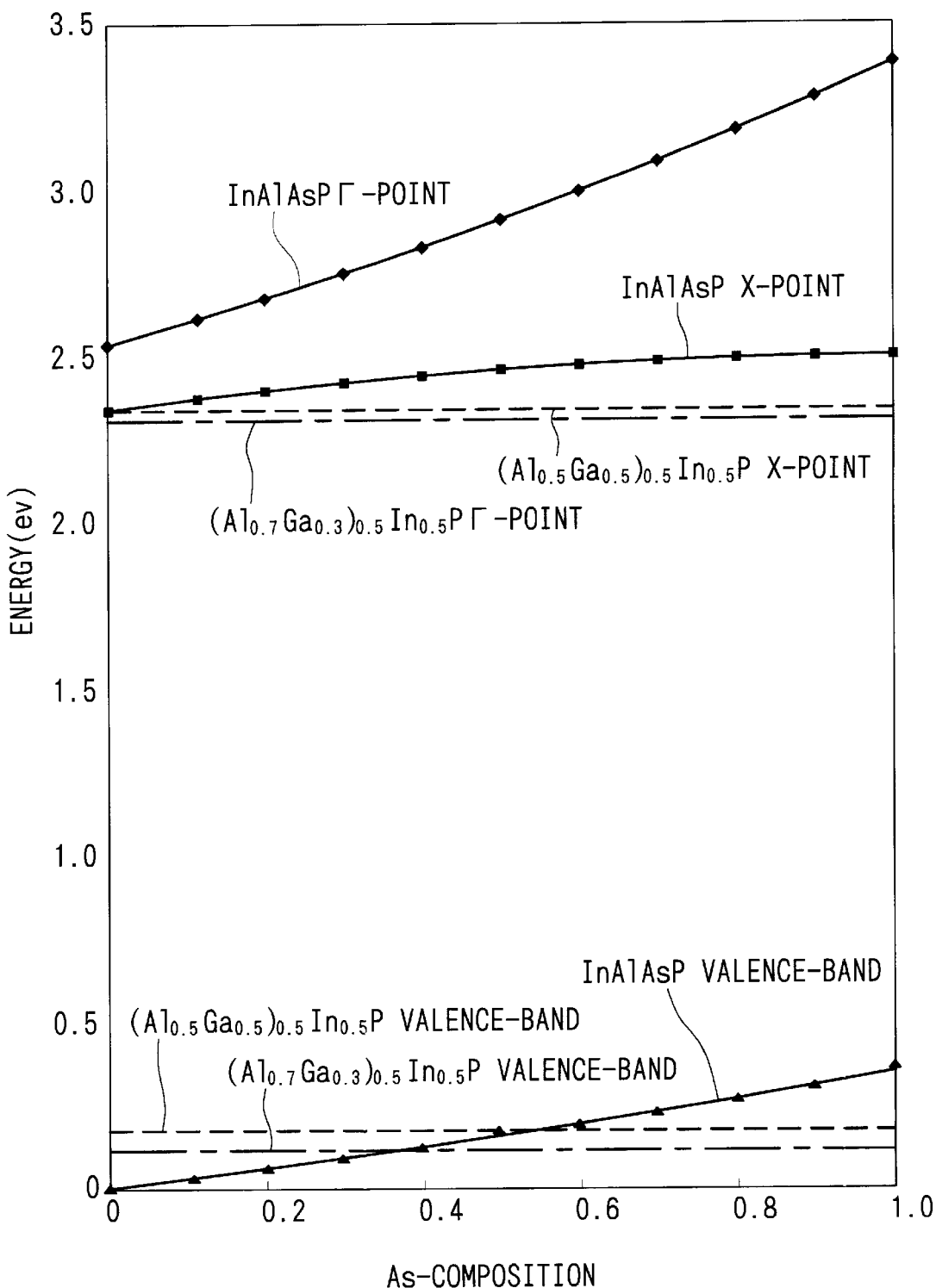
FIG. 10 is a diagram used for designing the electron barrier layer made of InAlAsP.

$In_{1-x}Al_xAs_yP_{1-y}$ is a material having high conduction band energy and having a lattice which matches with that of the GaAs substrate. FIG. 10 illustrates characteristics of $In_{1-x}Al_xAs_yP_{1-y}$ which is also a lattice matching the GaAs substrate, in terms of the relationship between its band edge energy and the composition of As. The broken lines show the band end energy of $(Al_{0.5}Ga_{0.5})_{0.5}In_{0.5}P$, and the alternate long-and-short-dashed lines show the band end energy of $(Al_{0.7}Ga_{0.3})_{0.5}In_{0.5}P$. The higher energy level of the conduction band selected from among the two energy levels of the Γ-point and the X-point is shown in the figure. FIG. 10 shows that when $(Al_{0.5}Ga_{0.5})_{0.5}In_{0.5}P$ or $(Al_{0.7}Ga_{0.3})_{0.5}In_{0.5}P$ is used as the cladding layer, the composition of As in the electron barrier layer should be more than 0.6, in order to obtain an energy difference of more than 100 meV at the X-point. When the composition of As is more than 0.6, the energy difference at the Γ-point is 600 meV, which satisfies the above condition; thus, a suitable material for the electron barrier is $In_{1-x}Al_xAs_yP_{1-y}$ which contains more than 0.6 of As. The material which possesses a lattice conformity with the GaAs substrate is described in detail. It is, however, even possible to use materials whose lattice does not matching that of GaAs, when the electron barrier layer is quite thin. In particular, a material which has a smaller lattice than that of the substrate is subjected to tensile strain when it is formed as the electron barrier layer. The energy of the electron barrier layer at the X-point is made to be higher, so that a material with a smaller lattice parameter is suitable as the material for the electron barrier layer. An example of such material is $In_{1-x}Ga_xAs_yP_{1-x}$.

The two methods described above allow the formation of a high electron barrier between the light guide layer and the p-type clad layer and the electron barrier layer suppresses the leakage of electrons at even higher temperatures. The above two methods can be utilized solely or in a combined manner. Furthermore, these means are useful for improvement of laser performances at higher temperatures, even for lasers which are not designed to be self-sustained pulsation-type lasers or which do not include the saturable absorbing layer.

Figure 1:
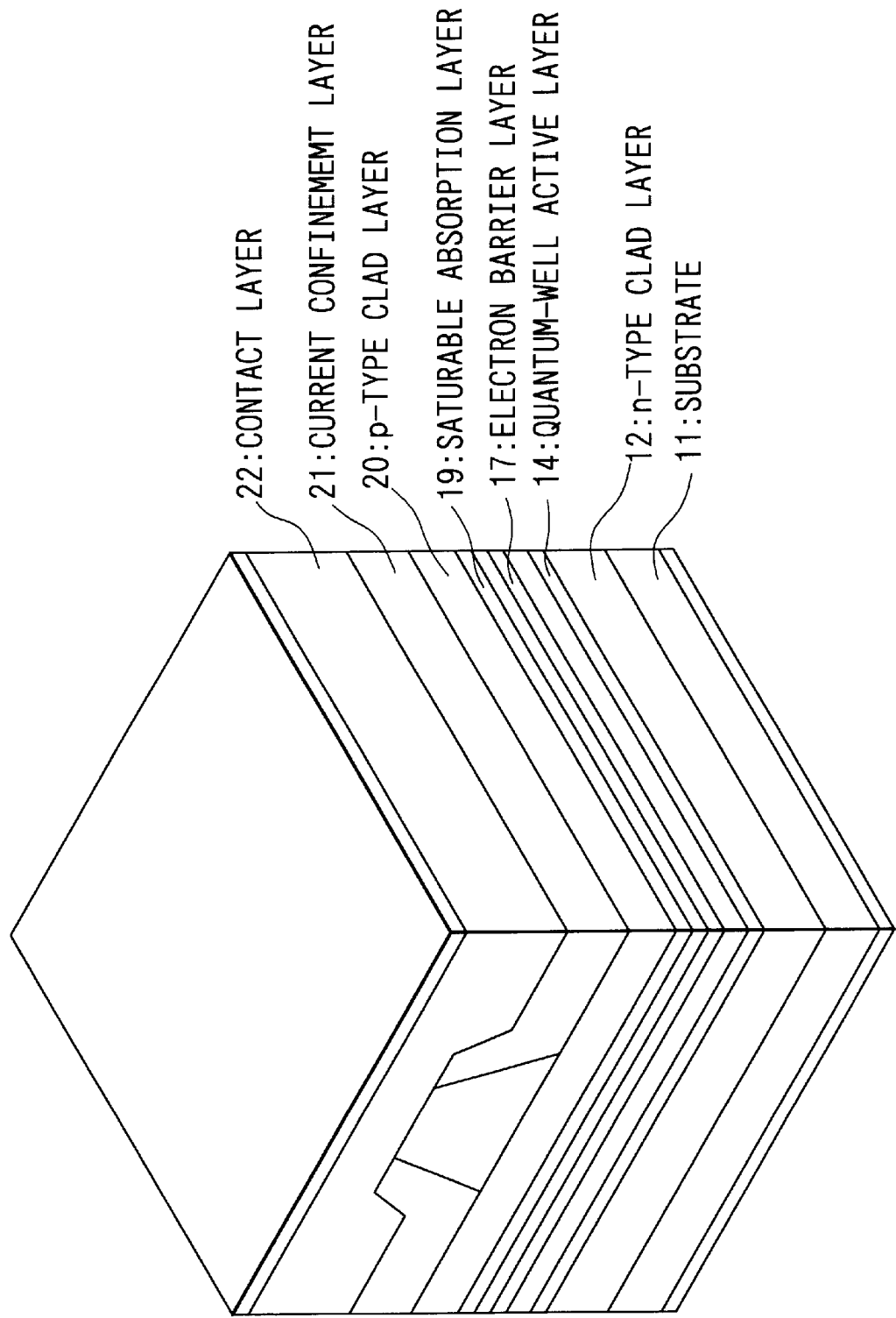
FIG. 1 is a perspective view showing the structure of a preferred embodiment of a semiconductor laser.

FIG. 1 shows a structure of the laser according to one embodiment of the present invention. FIG. 2 is the band diagram of the conduction band in the laser of the present invention. The laser of the present invention has a double-hetero structure comprising an n-type cladding layer 12 made of Si-doped $(Al_{0.7}Ga_{0.5})_{0.5}In_{0.5}P$, a guide layer 13 made of Si-doped $(Al_{0.5}Ga_{0.5})_{0.5}In_{0.5}P$ at a thickness of 50 nm, a quantum-well active layer 14 comprising a well layer 141 of undoped $Ga_{0.58}In_{0.52}P$ at a thickness of 8 nm and a barrier layer 142, 6 nm thick central layer of which is doped with Si, made of $(Al_{0.5}Ga_{0.5})_{0.47}In_{0.43}P$ at the thickness of 8 nm, a guide layer 15 made of Si-doped $(Al_{0.5}Ga_{0.5})_{0.5}In_{0.5}P$ at a thickness of 50 nm, a first spacer layer 16 made of undoped $(Al_{0.7}Ga_{0.3})_{0.5}In_{0.5}P$ at a thickness of 10 nm, an electron barrier layer 17 made of Zn-doped AlAs at a thickness of 10 nm, a second spacer layer 18 made of Zn-doped $(Al_{0.7}Ga_{0.3})_{0.5}In_{0.5}P$ at a thickness of 10 nm, a saturable absorbing layer 19 with a quantum well structure made of $Ga_{0.58}In_{0.42}P$ at a thickness of 10 nm, and a p-type cladding layer 20 made of Zn-doped $(Al_{0.7}Ga_{0.3})_{0.5}In_{0.5}P$. All of the layers are stacked in the order as described above. Furthermore, a mesa stripe is formed by etching, in which a current confinement layer 21 is formed by stacking and growing n-type AlInP and n-type GaAs layers alternately. Finally, a p-type contact layer 22 made of GaAs is formed on the top surface to yield a semiconductor laser. The width of the mesa stripe was 4 μm and the depth was adjusted so as to obtain an equivalent refractive index difference of $2.2 \times 10^{-2}$. Consequently, the laser lases light with a single energy mode and with a traverse vibrating mode.

The saturable absorbing layer 19 plays a role for the laser showing the self-sustained pulsation. In this example, $Ga_{0.58}In_{0.42}P$ was used as a material of the saturated absorption layer. The saturable absorbing layer has a light confinement coefficient of about 1%, and has a mode loss of about 30 $cm^{-1}$, which is equivalent with the mode loss of a resonator, and which is sufficient to show the self-sustained pulsation. The light confinement coefficient can be controlled by the thickness of the first spacer layer and by the thickness of the second spacer layer.

As described above, the saturable absorbing layer is required to have a shorter carrier life and a higher differential gain coefficient than those of the active layer in order to realize the self-sustained pulsation. Carrier life of the saturable absorbing layer can be reduced by p-type doping. According to the inventor's experiments, the carrier life of the saturable absorbing layer is reduced to 0.4 ns by doping Zn at a concentration of $2 \times 10^{18}$ $cm^{-2}$. Since the carrier life of the active layer is about 1 ns, the saturable absorbing layer of the present invention satisfies the condition of self-sustained pulsation. The undoped first spacer layer 15 is provided to prevent Zn from diffusing into the n-doped layer.

Figure 3:
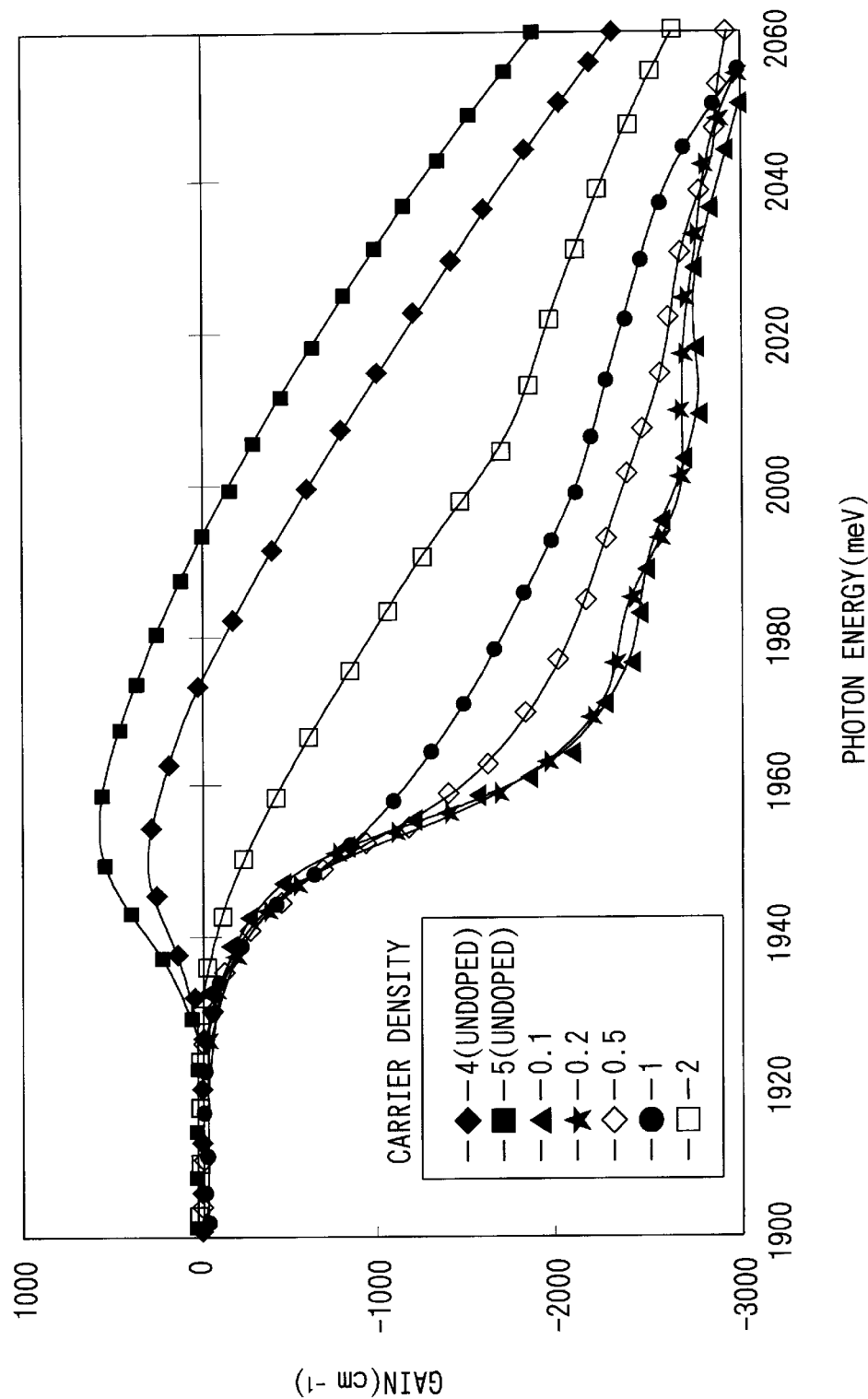
FIG. 3 is a diagram showing a relationship between the gain and the photon energy used for designing a saturable absorbing layer.

The band-gap of the saturable absorbing layer 19 must be suitably determined in order to obtain high differential gain. FIG. 3 is a diagram showing the change of the gain spectrums of the n-doped quantum well when carrier concentration is varied, in order to design the saturable absorbing layer. The band-gap (light transition energy) of the same quantum well is 1985 meV when carriers are not doped. For reference, gain spectrums of undoped material for the active layers with the same composition and at the same thickness are also shown in the figure.

Since the composition or the thickness of the saturable absorbing layer can be determined independently from the active layer, the home position of the diagram representing gain spectrums of the saturable absorbing layer and the active layer versus photon energy may be shifted. The gain of the saturable absorbing layer changes extensively with the change of the carrier concentration (that is, the differential gain is large) in the range of photon energy from 1960 meV to 2000 meV. It is desirable that the photon energy at the laser oscillation be located in the above range; that is, the gain peak of the active layer should be located within that range. Generally, the peak gain of the active layer is about 30 meV lower than the light-transition energy in the case where the carrier is not injected. Thus, in the case where the carriers are not injected, the light-transition energy of the active layer may be within the range of 1990 meV to 2030 meV. From the above assumption, the light transition energy of the saturable absorbing layer can be obtained when the carrier of the active layer is not injected. That is, it is desirable that the energy of the band-gap of the saturable absorbing layer be in a range from 5 meV to 45 meV lower than that of the active layer, when expressed as the light transition energy. If the band-gap of the saturable absorbing layer is below that energy range, the band-gap shrinks (band-gap shrinkage) with the increase of carrier population, and instead the resultant absorption increases. If, on the other hand, the band-gap of the saturable absorbing layer is beyond that energy range, the change of the absorption is canceled due to influences of the transition between subbands. In this embodiment, the saturable absorbing layer is constructed as a thick quantum well 2 nm thick, and the quantum well is made of the same material as that of the active layer, so that the saturable absorbing layer has a transition energy of 20 meV which is within the above energy range and satisfies the conditions of the layer.

As described above, the saturable absorbing layer of the present invention satisfies required conditions in absorption loss, carrier life, and in differential gain, such that the semiconductor laser of the present invention exhibits self-sustained pulsation.

Regarding the prevention of leakage of electrons from the active layer at high temperature ranges, the above two methods are adopted in the semiconductor laser of the present invention. In contrast to electrons, holes have large effective mass so that leakage of holes are negligible. Again, the above two methods will be summarized.

The first method is to make a higher barrier by creating an electrostatic potential between the guide layer and the cladding layer. In this embodiment, the first method is realized by doping a n-type dopant to the guide layer and by doping a p-type dopant to the cladding layer. Electrons are confined by the electrostatic potential created between the guide layer and the cladding layer, so that the loss of the saturable absorbing layer is suppressed by preventing electrons from entering into the saturable absorbing layer. As a result, the band-gap of the saturable absorbing layer can be established at higher values and the threshold current at room temperature can be prevented from increasing. In addition, the differential gain is reduced by n-type doping in the active layer and by consequent reduced carrier population at the threshold. Thus, together with the effect of increased differential gain of the saturable absorbing layer by p-type doping, further suppression of the loss of the saturable absorbing layer is produced. Although this embodiment adopts a modified dope structure in which merely a portion of-the barrier layer 142 is doped with an impurity, it is possible to construct quantum-well structures in which one way is to dope homogeneously in both the well layer 141 and the barrier layer 142 or another way is to dope only in the well layer. The selection of the dope structure is performed to be able to satisfy conditions including a crystal quality, such as the lattice parameter of the crystal.

Figure 8:
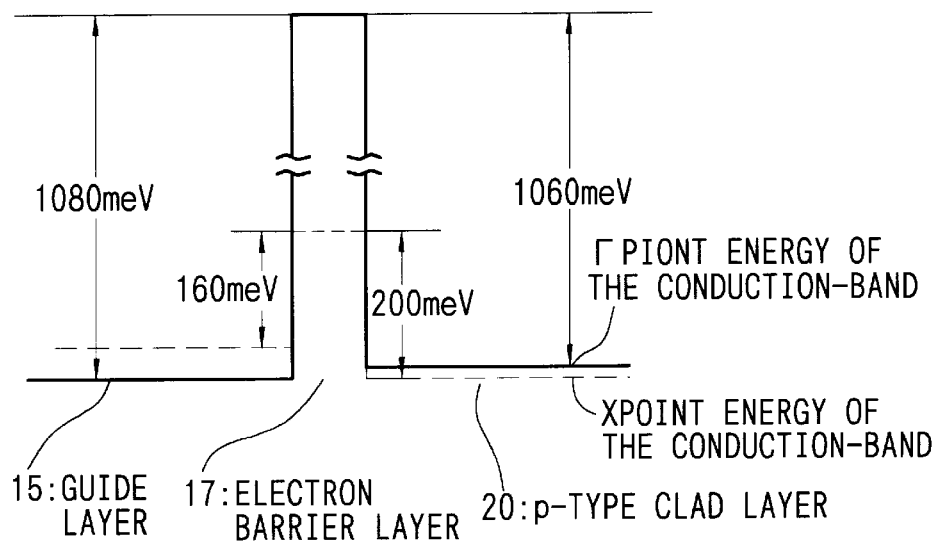
FIGS. 8 and 9 show band diagrams when the electron barrier layer made of AlAs is inserted.
Figure 9:
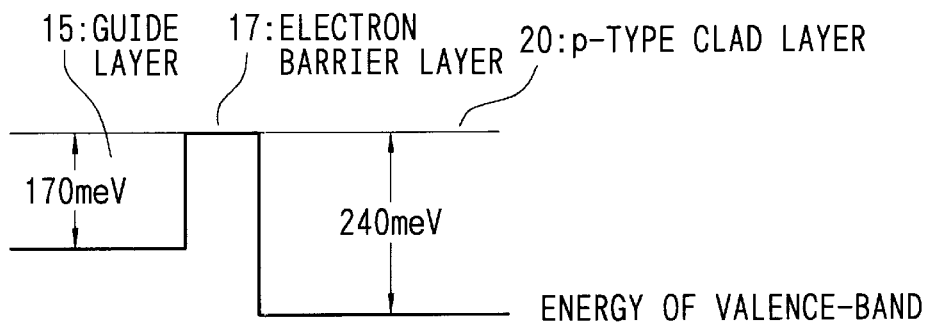

The second method is to insert the electron barrier layer made of a material having high energy conduction band between the guide layer 15 and the p-type clad layer 20. FIGS. 8 and 9 illustrate the band diagram when an electron barrier layer 17 made of AlAs is inserted between the guide layer 15 made of $(Al_{0.5}Ga_{0.5})_{0.5}In_{0.5}P$ and the p-type clad layer 20 made of $(Al_{0.7}Ga_{0.3})_{0.5}In_{0.5}P$. Since the conduction-band energies of the electron barrier layer at either the Γ and the X-points are far higher that those of the guide layer made of $(Al_{0.5}Ga_{0.5})_{0.5}In_{0.5}P$ and the p-type clad layer made of $(Al_{0.7}Ga_{0.3})_{0.5}In_{0.5}P$, leakage of electrons can be prevented effectively. On the other hand, this electron barrier constitutes a so-called type II well in which the potential for the hole is low. Accordingly, a concern might arise that transportation of positive carriers to the active layer may be obstructed. However, such obstruction is negligible due to the fact that the potential difference is as low as 170 meV and that the electron barrier layer is filled with excess positive holes by p-type dopants.

Therefore, the high electron barrier layer provided by the above two methods effectively suppresses leakage of electrons from the active layer even at high temperature ranges.

As described above, this invention provides a semiconductor laser with long life, stable threshold current under temperature changes, and low noise.

What is claimed is:

1. A semiconductor laser comprising:
   a substrate for the semiconductor laser;
   an n-type clad layer on said substrate;
   an active layer on said n-type clad layer;
   a guide layer directly on and in direct contact with said active layer; and
   a p-type cladding layer on said guide layer;
   wherein at least a portion of said guide layer is doped with a n-type dopant.

2. A semiconductor laser according to claim 1, wherein at least a portion of said active layer is doped with an n-type dopant.

3. A semiconductor laser according to claim 1, wherein said semiconductor laser includes a saturable absorbing layer in said p-type cladding layer.

4. A semiconductor laser according to claim 3, wherein the band-gap value of said saturable absorbing layer is less than the band-gap value of said active layer.

5. A semiconductor laser according to claim 4, wherein a band-gap value of an undoped material forming said saturable absorbing layer is from 5 meV to 45 meV smaller than the band-gap value of an undoped material forming said active layer.

6. A semiconductor laser according to claim 3, wherein said saturable absorbing layer is composed of a quantum-well structure.

7. A semiconductor laser according to claim 1, wherein said active layer is composed of a quantum-well structure.

8. A semiconductor laser according to claim 7, further comprising an electron barrier layer separate from said active layer and that is between said p-type cladding layer and said guide layer.

9. A semiconductor laser comprising:
   a substrate for the semiconductor laser;
   an n-type cladding layer on said substrate;
   an active layer on said n-type cladding layer and comprising a well layer between two barrier layers;
   a guide layer on said active layer, at least a portion of said guide layer is doped with an n-type dopant;
   a p-type cladding layer on said guide layer;
   wherein an electron barrier layer separate from said active layer barrier layers is either between said guide layer and said p-type cladding layer or in said p-type cladding layer.

10. A semiconductor laser according to claim 9, wherein said active layer is doped with an n-type dopant.

11. A semiconductor laser according to claim 9, wherein said active layer is composed of a quantum-well structure.

12. A semiconductor laser according to claim 9, wherein an n-type dopant is doped in at least a portion of said active layer.

13. A semiconductor laser according to claim 9, wherein said active layer is made of a material selected from materials consisting of GaIn or AlGaInP, said p-type clad layer is made of AlGaInP, and said electron barrier layer is made of a material selected from materials consisting of AlAs, InAlAs, or InGaAsP.

14. A semiconductor laser according to claim 9, wherein said active layer is made of a material selected from materials consisting of GaInP or Al GaInP, said p-type cladding layer is made of AlGaInP, said electron barrier layer is made of a material selected from materials consisting of InAlAsP or InGaAsP.

15. A semiconductor laser according to claim 9, wherein said electron barrier layer is made of $In_{1-x}Al_xAs_yP_{1-y}$, wherein $0 \leq x \leq 1$ and $0.6 \leq y \leq 1$.

16. A semiconductor laser according to claim 9, wherein said p-type cladding layer includes a saturable absorbing layer, and said electron barrier layer is between said saturable absorbing layer and said guide layer.

17. A semiconductor laser according to claim 16, wherein the band-gap value of said saturable absorbing layer is less than that of the active layer.

18. A semiconductor laser according to claim 16, therein a band-gap value of an undoped material of said saturable absorbing layer is from 5 meV to 45 meV smaller than the band-gap value of undoped material of said active layer.

19. A semiconductor laser according to claim 16, wherein said saturable absorbing layer is composed of a quantum-well structure.

20. A semiconductor laser according to claim 9, wherein at least one undoped spacer layer is between said guide layer and said p-type cladding layer.

21. The laser of claim 9, wherein said guide layer is directly on and in direct contact with said active layer.

* * * * *